(12) United States Patent
Lung et al.

(10) Patent No.: US 9,019,771 B2
(45) Date of Patent: Apr. 28, 2015

(54) DIELECTRIC CHARGE TRAPPING MEMORY CELLS WITH REDUNDANCY

(71) Applicants: Hsiang-Lan Lung, Ardsley, NY (US); Yen-Hao Shih, Elmsford, NY (US); Erh-Kun Lai, Elmsford, NY (US); Ming-Hsiu Lee, Hsinchu (TW)

(72) Inventors: Hsiang-Lan Lung, Ardsley, NY (US); Yen-Hao Shih, Elmsford, NY (US); Erh-Kun Lai, Elmsford, NY (US); Ming-Hsiu Lee, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 433 days.

(21) Appl. No.: 13/661,723

(22) Filed: Oct. 26, 2012

(65) Prior Publication Data

US 2014/0119127 A1    May 1, 2014

(51) Int. Cl.
  *G11C 16/06*    (2006.01)
  *G11C 16/04*    (2006.01)
  *G11C 16/10*    (2006.01)

(52) U.S. Cl.
  CPC .......... *G11C 16/0475* (2013.01); *G11C 16/10* (2013.01)

(58) Field of Classification Search
  CPC .......................... G11C 16/0475; G11C 16/10
  USPC ...................... 365/185.21, 185.03, 185.24
  See application file for complete search history.

(56) References Cited

U.S. PATENT DOCUMENTS

| 7,956,424 | B2 | 6/2011 | Toyama |
| 8,004,888 | B2 * | 8/2011 | Parker ..................... 365/185.03 |
| 8,076,715 | B2 | 12/2011 | Melik-Martirosian |
| 2008/0080251 | A1 | 4/2008 | Chang et al. |
| 2009/0212348 | A1 | 8/2009 | Toyama |
| 2010/0074004 | A1 | 3/2010 | Parker |
| 2010/0074007 | A1 | 3/2010 | Parker |
| 2010/0265773 | A1 | 10/2010 | Lung et al. |
| 2011/0038208 | A1 | 2/2011 | Chang et al. |
| 2011/0233651 | A1 | 9/2011 | Inoue et al. |
| 2012/0287724 | A1 * | 11/2012 | Tsai et al. ................ 365/185.26 |

OTHER PUBLICATIONS

Kinoshita, A, et al., "High-Performance 50-nm-Gate-Length Schottky-Source/Drain MOSFETs with Dopant-Segregation Junctions," IEEE Symp. on VLSI Technology Digest of Papers, Jun. 14-16, 2005, pp. 158-159.
Kinoshita, A, et al., "Solution for High-Performance Schottky-Source/Drain MOSFETs: Schottky Barrier Height Engineering with Dopant Segregation Technique," IEEE Symp. on VLSI Technology Digest of Papers, Jun. 15-17, 2004, pp. 168-169.
Tanaka, H., et al., "Bit Cost Scalable Technology with Punch and Plug Process for Ultra High Density Flash Memory," IEEE Symp. on VLSI Technology Jun. 12-14, 2007, pp. 14-15.

* cited by examiner

*Primary Examiner* — Toan Le
(74) *Attorney, Agent, or Firm* — Haynes Beffel & Wolfeld LLP

(57) ABSTRACT

A memory cell array of dielectric charge trapping memory cells and method for performing program, read and erase operations on the memory cell array that includes bits stored at charge trapping sites in adjacent memory cells. A bit of information is stored at a first charge trapping site in a first memory cell and a second charge trapping site in a second adjacent memory cell. Storing charge at two trapping sites in adjacent memory cells increases data retention rates of the array of memory cells as each charge trapping site can be read to represent the data that is stored at the data site. Each corresponding charge trapping site can be read independently and in parallel so that the results can be compared to determine the data value that is stored at the data site in an array of dielectric charge trapping memory cells.

14 Claims, 7 Drawing Sheets

DIELECTRIC CHARGE TRAPPING MEMORY CELLS WITH REDUNDANCY

BACKGROUND

1. Field

The present technology relates to integrated circuit technology including new methods of operating memory cells.

2. Description of Related Art

Flash memory is a class of non-volatile integrated circuit memory technology. Traditional flash memory employs floating gate memory cells. As the density increases in memory devices, and the floating gate memory cells get closer and closer together, interference between the charge stored in adjacent floating gates becomes a problem. This is limiting the ability to increase the density of flash memory based on floating gate memory cells. Another type of memory cell used for flash memory can be referred to as a charge trapping memory cell, which uses a dielectric charge trapping layer in place of the floating gate. Charge trapping memory cells use dielectric charge trapping material that does not cause cell-to-cell interference like that encountered with floating gate technology, and is expected to be applied for higher density flash memory.

One advantage of dielectric charge trapping memory cells over floating gate memory cells, is that the charge can be trapped in discrete and separate locations within the charge trapping layer for each individual memory cell. Circuit designers have used such advantage to increase the amount of data that can be stored for a number of memory cells within an array of memory cells. Specifically, by storing charge at two separate locations in the charge trapping layer of a memory cell, each memory cell can store more than one bit of data. For example, so called "mirror bit" technology has been used in which two bits of data are stored in a dielectric charge trapping memory cell at two different sites. Examples of dielectric charge trapping flash memory can be seen in patent application Publication No. US 2010/0074007; Application No. 12/234,737, entitled "Flash Mirror Bit Architecture Using Single Program and Erase Entity as Logical Cell."

While dielectric charge trapping memory technologies have continued to develop, problems with data retention in such charge trapping memory cells can occur. For example, memory cells in a high threshold state that is established by trapping electrons, or negative charge, in the charge trapping layer, can lose charge over time. With sufficient charge loss, the data value stored in the cell can be lost. The charge retention can be a particular problem in advanced memory designs, including thin film transistor memory devices and in 3D stacked memory devices.

It is therefore desirable to provide a dielectric charge trapping memory cell array design with improved data retention rates.

SUMMARY

The present technology includes an array of dielectric charge trapping memory cells and a method of operating memory cells which provides for improved reliability while maintaining high density. The array of dielectric charge trapping memory cells includes a plurality of bit lines BL(i), for i between 0 and N, and a plurality of word lines WL(j), for j between 1 and M. A plurality of columns of physical memory cells and a plurality of rows of physical memory cells are included. Each column is disposed between bit line BL(i) and bit line BL(i+1), and each row R(j) of the memory cells is coupled to a corresponding word line WL(j). A memory cell in the array has a first charge trapping site (right side) adjacent to the bit line BL(i+1) and a second charge trapping site (left side) adjacent to the BL(i).

The array is operated by a method that includes writing a data value in a logical cell for a selected column address $A_C(y)$, wherein y is between 1 and N−1, and a selected row address $A_R(x)$, wherein x is between 1 and M in the array, by applying program and erase operations to set threshold states representing said data value both in the first charge trapping site (right side) in the memory cell on the left of a BL(y) between bit lines BL(y−1) and BL(y), and in the second charge trapping site (left side) in the memory cell on the right of BL(y) between bit lines BL(y) and BL(y+1). As a result, two physical memory cells redundantly store the data value for a single logical cell.

The array is operated by a method that includes reading a data value for a selected column address AC(y), wherein y is between 1 and N−1, and a selected row address AR(x), wherein x is between 1 and M, by sensing the threshold states both in the first charge trapping site in the memory cell between bit lines BL(y−1) and BL(y), and in the second charge trapping site in the memory cell in column between bit lines BL(y) and BL(y+1), and determining that the data value for the logical cell is that corresponding with the highest sensed threshold state.

As a result of the method of operating the array, charge loss in one of the two physical cells used to store the data for a single logical cell does not cause loss of the data value, providing in effect 1:1 error correction codes with essentially no increase in array area.

Other aspects and advantages of the present technology can be seen on review of the drawings, the detailed description, and the claims which follow.

DETAILED DESCRIPTION

A detailed description of embodiments of the present invention is provided with reference to the FIGS. 1-7.

Figure 1A:
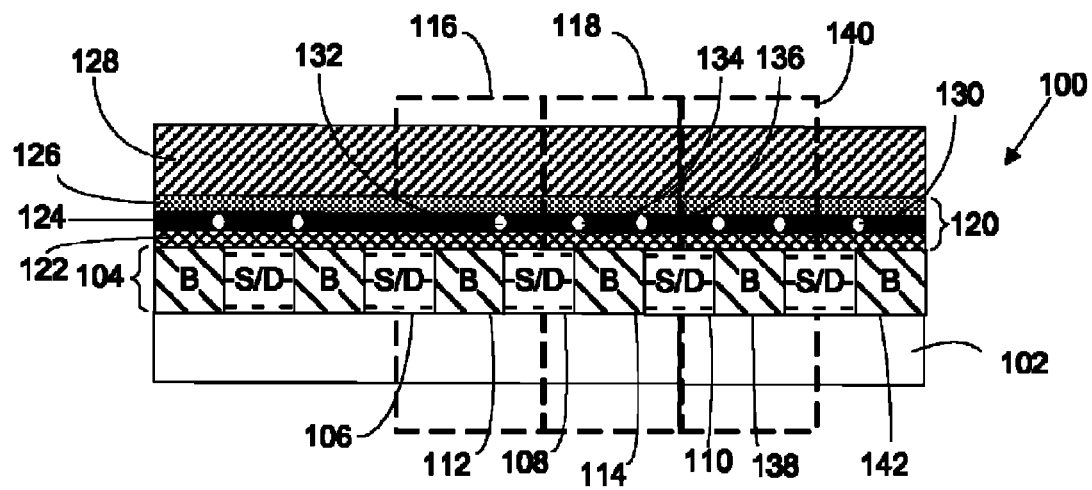
FIG. 1A is a cross-sectional view of a portion of a row of memory cells.
Figure 1B:
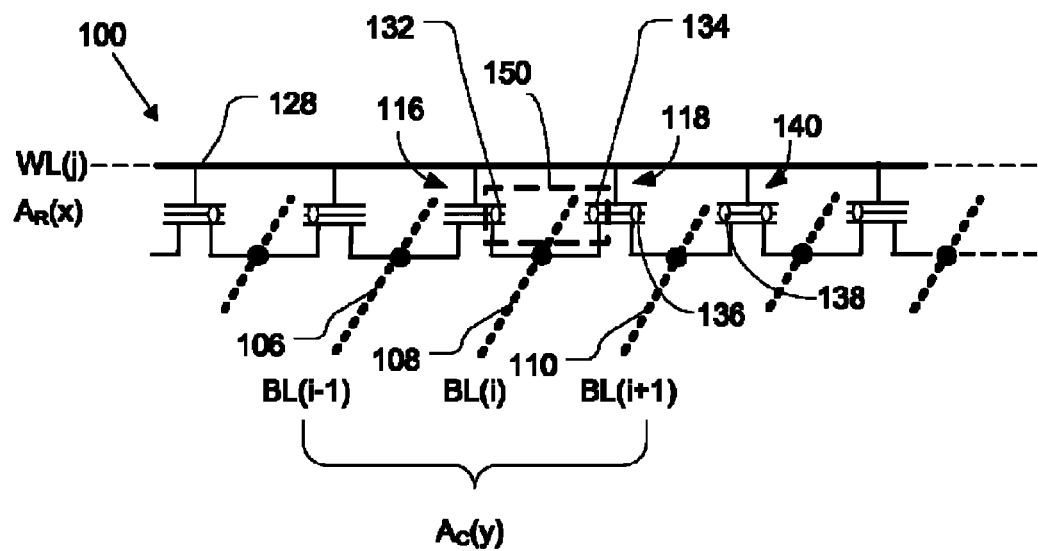
FIG. 1B is the corresponding circuit diagram of the portion of a row of memory cells that is shown in FIG. 1A.

FIG. 1A is a cross-sectional view of a portion of a row of memory cells 100. FIG. 1B is the corresponding circuit diagram for the portion of the row of memory cells 100. The row of memory cells is formed on a substrate 102. The substrate 102 can be an insulator, such as silicon oxide, or a semiconductor. The illustration shows a bit line layer 104 on the substrate 102. The bit line layer 104 includes bit line regions 106, 108 and 110 and semiconductor body regions 112 and 114 between the bit line regions. As such, a repeated structure of bit line regions 106, 108 and 110 and semiconductor body regions 112 and 114 within the bit line layer 104 is provided. The bit line regions, which act as source/drain terminals for the memory cells, can be biased to act as needed for the memory cells during program, read or erase operations. Examples of bias arrangements applied for program, erase and read operations are provided below. For clarity purposes, the term "programming" as used herein refers to an operation that increases the threshold voltage of a memory cell within an array of memory cells. For clarity purposes, the term "erase" refers to an operation which decreases the threshold voltage of a memory cell in an array of memory cells.

The row of memory cells 100 includes a dielectric charge trapping structure 120 over the bit line layer 104. A word line 128 overlies the dielectric charge trapping structure 120, and serves as the control gate for the memory cells on the row of memory cells 100. A physical memory cell (e.g. 116, 118, 140) for the purpose of this description comprises a field effect transistor having a body region "B" between two bit line regions acting as source/drain terminals "S/D," with an overlying dielectric charge trapping structure and control gate in the word line 128.

The dielectric charge trapping structure 120 includes a first dielectric layer 122, a second dielectric layer 124 and a third dielectric layer 126. The second dielectric layer 124 is a charge trapping layer, in which the amount and net polarity of charge trapped during a program operation or an erase operation determines a threshold state for the memory cell.

The first and third dielectric layers 122 and 126 can be configured either as a tunneling or blocking layer to support tunneling between the word line 128 and the dielectric charge trapping structure 120, or between the source/drain terminals and/or the body regions in the bit line layer 104 and the dielectric charge trapping structure 120.

Charge is trapped in the charge trapping layer at charge trapping sites. In this configuration, each memory cell has two charge trapping sites that can be located near opposing ends of the channel of a memory cell. For example, the physical memory cell 118 has charge trapping sites 134 and 136 that are located near opposing ends of the channel of the memory cell. The threshold state of the physical cell depends on the charge in one of the two charge trapping sites, and on the direction or the read bias, as is known from "mirror bit" technology. For example, a first physical memory cell 116 between the adjacent bit line regions 106 and 108 has charge trapping sites that are adjacent to each of the adjacent bit line regions 106 and 108. The second physical memory cell 118 includes source/drain terminals in the bit line regions 108 and 110, and a semiconductor body region 114 between the bit line regions 108 and 110. The memory cell 140 includes source/drain terminals in the bit line regions 110 and 142, and a semiconductor body region 138. For purposes of illustration the charge trapping sites (e.g. site 130) that have an amount of charge stored in them to cause a high threshold state are illustrated by small ovals on the diagram in FIG. 1A. Charge trapping sites that do not establish a high threshold state in this example exist but are not shown in the diagram.

An addressed data value can be written to a row of physical memory cells by program and erase operations, such as those described below, so that it is represented by the charge trapped in the charge trapping site (e.g. 132) on the right side of a first physical memory cell 116, and the charge trapped in the charge trapping site (e.g. 134) on the left side of a second physical memory cell 118. The threshold states of the first physical memory cell 116 using a right-side read, and the second physical memory cell 118 using a left-side read, can be sensed independently, using redundant read circuits. The results of the left-side read and the right-side read can be logically combined to determine the addressed data value. Using redundant read circuits, for example, the logic can assign the data value corresponding to the highest threshold state that is sensed from the pair of physical memory cells. In this manner, if one of the charge trapping sites has suffered charge loss causing a drop in threshold voltage out of a programmed high threshold state in one of the physical memory cells, then the redundant second charge trapping site that maintains the programmed high threshold state in the other of the physical memory cells can be used to define the stored data value.

FIG. 1B is a circuit diagram corresponding to the portion of a row of memory cells 100 that is shown in FIG. 1A. The word line 128 corresponds to a particular word line WL(j). The bit line regions 106, 108, 110 correspond to particular local bit lines BL(i−1), BL(i) and BL(i+1). A particular data value is stored in a data site 150 including the charge trapping sites 132, 134, at a logical row address AR(x) corresponding to the word line WL(i), and a logical column address AC(y), corresponding to a pair of columns of physical cells, which can be read using the combination of three local bit lines BL(i−1), BL(i) and BL(i+1). The logical address (AC(y), AC(x)) of the data site 150 is different from the physical row address (WL(j)) and column address (BL(i)) of the memory cells 116 and 118. Such difference in physical addresses and the logical addresses of the data sites will be discussed in more detail with reference to FIG. 2 below.

Figure 2:
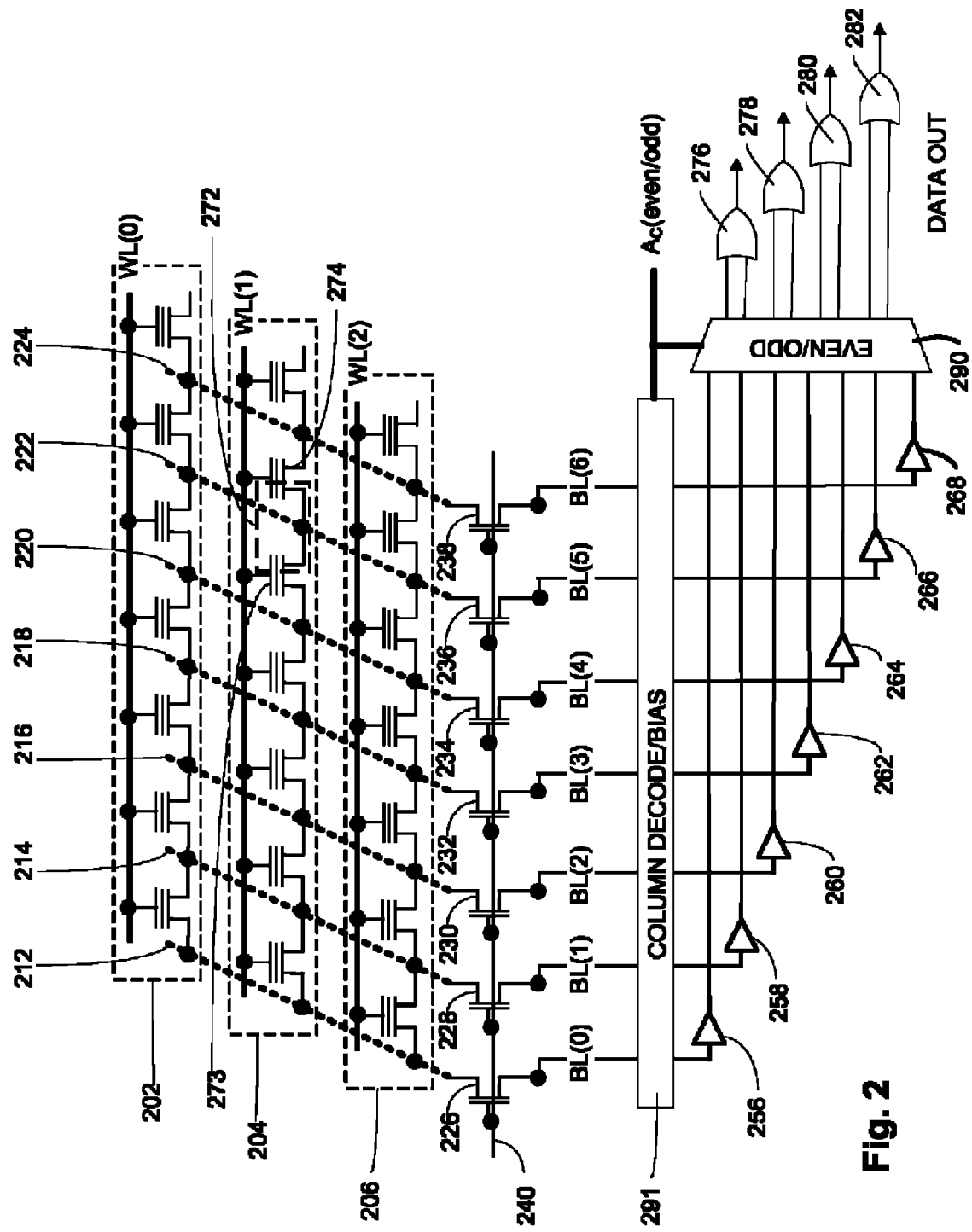
FIG. 2 is a circuit diagram showing a portion of an array of memory cells.

FIG. 2 is a circuit diagram showing a portion of an array of memory cells in an "AND" configuration. The array of memory cells includes rows of memory cells 202, 204 and 206, each coupled to a corresponding word line WL(i), and columns of memory cells each between a corresponding pair of local bit lines BL(i) that correspond to global bit lines BL(0) to BL(6). The adjacent memory cells in the array share local bit lines 212, 214, 216, 218, 220, 222 and 224. The local bit lines 212, 214, 216, 218, 220, 222 and 224 extend across multiple rows of memory cells 202, 204 and 206. As a result, columns of memory cells are created by the memory cells that are connected in parallel between the local bit lines.

The local bit lines 212, 214, 216, 218, 220, 222 and 224 are coupled individually to corresponding block select transistors 226, 228, 230, 232, 234, 236 and 238. The block select transistors 226, 228, 230, 232, 234, 236 and 238 are coupled to a block select line 240. The block select transistors are coupled to global bit lines BL(0) to BL(6). The global bit lines BL(0) to BL(6) are coupled to a column decode and bias circuit 291, which selectively connects the global bit lines to bias circuits used for establishing the read, program and erase operations, and to sense amplifiers 256, 258, 260, 262, 264, 266 and 268 according to the logical address for the data value.

The sense amplifiers 256, 258, 260, 262, 264, 266 and 268 are coupled to an "even/odd" multiplexer in this example, which supplies the results selectively in response to the logical column address AC(y) from even pairs or odd pairs of sense amplifiers to corresponding OR-gates 276, 278, 280, 282, . . . .

FIG. 2 is a diagram of an array of dielectric charge trapping memory cells including a plurality of bit lines BL(i), for i between 0 and N, and a plurality of word lines WL(j), for j between 1 and M, the array including a plurality of columns C(i) connected in parallel between adjacent bit line BL(i) and bit line BL(i+1), and a plurality of rows R(j) of physical memory cells corresponding to the word lines WL(j). A physical memory cell (e.g. cell 273 on word line WL(1) and between bit lines BL(4) and BL(5)), in the array has charge trapping sites adjacent to the bit line BL(4) on its left, and adjacent to the BL(5), on its right.

A data value can be written for a selected logical column address $A_C(y)$, wherein y is between 1 and N−1, and a selected logical row address $A_R(x)$, wherein x is between 1 and M in the array of dielectric charge trapping memory cells, by applying program and erase operations to set threshold states representing said data value in a logical cell 272. The logical cell 272 includes a first charge trapping site on the right side of the memory cell (e.g. cell 273) in column C(i−1) at row R(j), and in a second charge trapping site on the left side of the memory cell (e.g. cell 274) in column C(i) at row R(j).

A data value can be read for a selected column address AC(y), wherein y is between 1 and N−1, and a selected row address AR(x), wherein x is between 1 and M, by sensing the threshold states both in the first charge trapping site in the memory cell in column C(i−1) at row R(j), and in the second charge trapping site in the memory cell in column C(i) at row R(j), and determining that the data value is that corresponding with the highest sensed threshold state. In FIG. 2, the first charge trapping site for column C(i−1) is read by biasing the bit line BL(i−1) and bit line BL(i) for right-side read of the physical memory cell therebetween, and using a first sense amplifier coupled to bit line BL(i−1), and by biasing the bit line BL(i+1) and bit line BL(i) for left-side read of the physical memory cell therebetween, and using a second sense amplifier coupled to bit line BL(i+1). Then the outputs of the first and second sense amplifiers are selected using the multiplexer 290 in response to the logical column address AC, and supplied to corresponding OR-gates 276, 278, 280, 282, . . . .

When the array is configured to store a single bit per logical cell, the sense amplifiers output a logical "1" in this example to indicate the high threshold state, and a logical "0" to indicate the low threshold state. The OR-gate provides as output the date value of logical "1" therefore, if either of the sense amplifiers senses the high threshold state. In an alternative, the sense amplifiers could output a logical "0" for the high threshold state, in which case the OR-gate could be replaced by a NOR-gate.

For a memory storing multiple bits per logical cell, the sense amplifiers are configured to sense more than two threshold states. In multiple bits per logical cell embodiments, other logic could be utilized to produce an output that matches the highest sensed threshold state for the logical cell.

Figure 3:
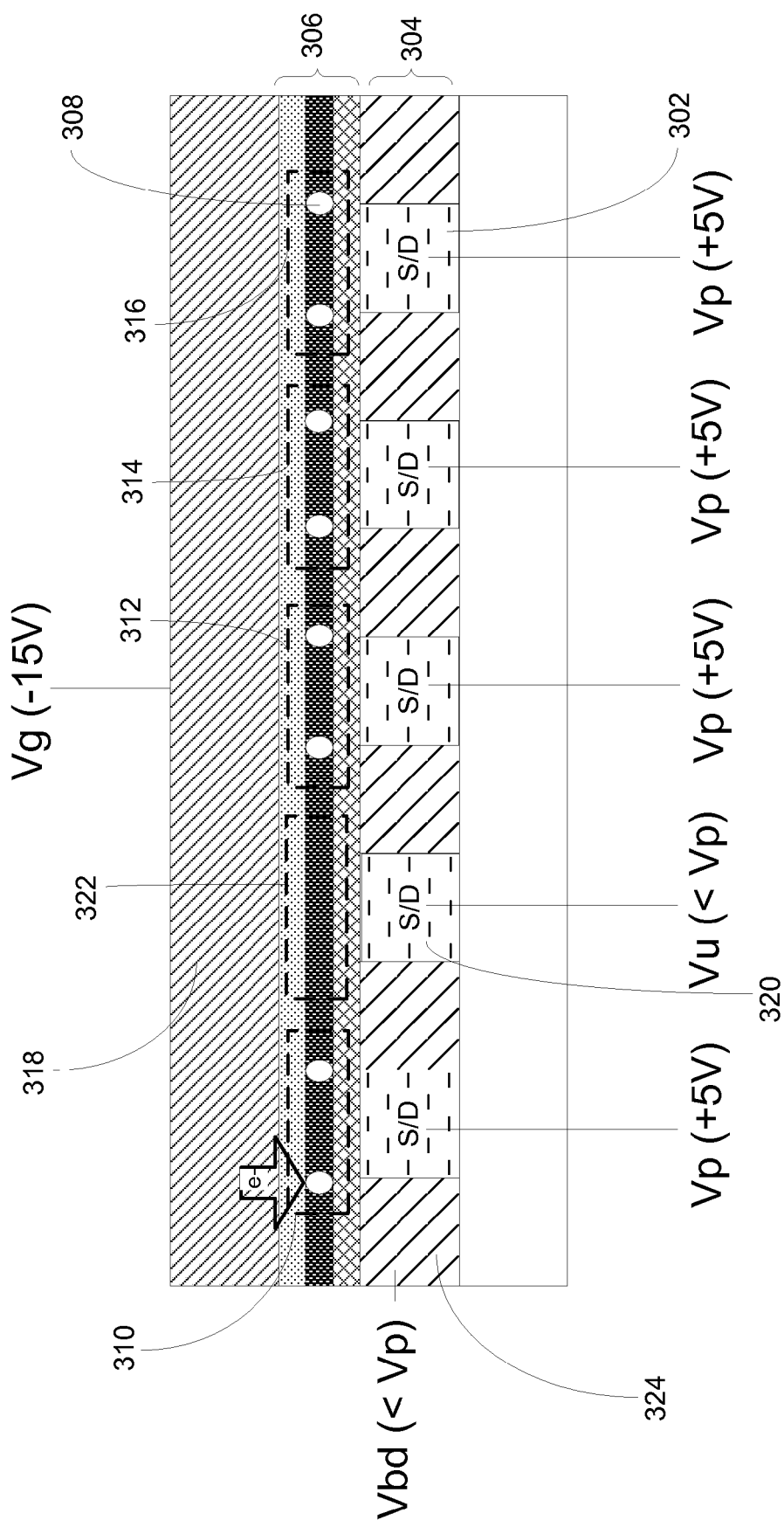
FIG. 3 is a cross-sectional view of a portion of a row of memory cells with an example applied program bias arrangement.

FIG. 3 is a cross-sectional view of a portion of a row of memory cells showing an example program bias arrangement, inducing a high threshold state in the selected logical memory location. The row of memory cells in this example includes bit line regions 302 within a bit line layer 304, which can be biased to act as either a source or drain during a read operation. Semiconductor body regions 324 are positioned between the bit line regions (e.g. 302) within the bit line layer 304. A dielectric charge trapping structure 306 is on top of the bit line layer 304, and includes charge trapping sites (e.g site 308). For purposes of illustration, the charge trapping sites selected for setting to a high threshold state are illustrated by open ovals like oval 308. In the illustrated portion of the row of memory cells, five logical cells 310, 312, 314, 316 and 322 are labeled using boxes. The program bias arrangement shown is set up to program four of the logical cells to the high threshold state.

In the example applied program bias arrangement that is shown in FIG. 3, a program bias Vp+5V is applied to the bit line regions that are shared between adjacent memory cells that form logical cells 310, 312, 314 and 316. A gate bias Vg is applied to the word line 318 of the memory cells in the row of memory cells. A body bias Vbd is applied to the body regions. The body bias (Vbd) is less than Vp, so that adjacent cells are not disturbed. Likewise, the bit lines (e.g. 320) for unselected cells (e.g. 322) are biased at an inhibit voltage Vu, that is less than Vp to inhibit programming of unselected cells.

The voltage potential that is created between the word line 318 and the bit line regions that are biased with a program bias Vp+5V creates an electric field through the charge trapping sites of the corresponding logical cells 310, 312, 314 and 316. Such electric field causes Fowler-Nordheim (FN) tunneling by which charge becomes trapped in the charge trapping sites in regions on each side of the selected bit line which overlaps with the body regions of the two memory cells adjacent to the bit line. The trapped charge can therefore control the threshold voltage for a right-side read of the cell on the left, and a left-side read of the cell on the right.

As shown in FIG. 3, the charge can tunnel into the charge trapping sites from the word line. Because the two physical memory cells are read with the selected bit line bias as the source, the program bias can be termed a source side injection with FN tunneling from the word line. In this configuration, the tunneling layer of the charge trapping structure is positioned over the charge trapping layer, adjacent to the word line. Under the applied bias arrangement that is shown in FIG. 3, multiple logical cells are programmed in parallel.

The inhibit voltages on the unselected bit lines and on the body regions, Vu and Vbd, can be applied using direct biasing circuits coupled to the body regions and the unselected bit lines. Alternatively, both Vu and Vbd can be generated by floating coupling. Specifically, in generating Vu and Vbd through floating coupling, the regions upon which it is desired for Vu and Vbd to be applied to are left floating during operation. As a result, the Vu and Vbd voltage levels in these regions can be caused to be lower than Vp through capacitive coupling with the surrounding regions, such as by the coupling caused by a transition to a negative voltage on the word line.

Other program bias arrangements can be used as well.

Figure 4:
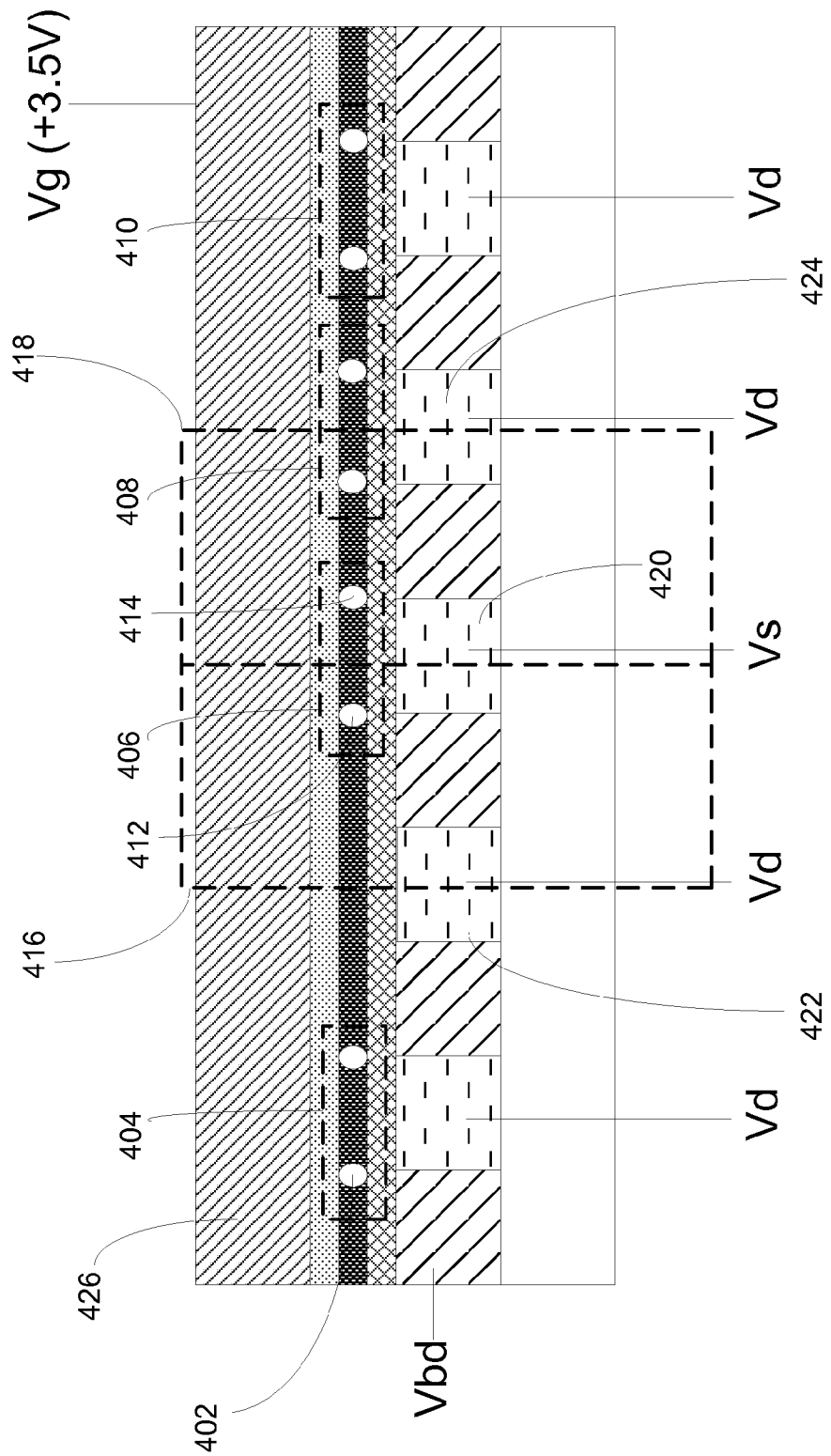
FIG. 4 is a cross-sectional view of a portion of a row of memory cells with an example applied read bias arrangement.

FIG. 4 is a cross-sectional view of a portion of a row of memory cells showing an example read bias arrangement. Charge is stored in charge trapping sites (e.g. 402) of adjacent physical memory cells from a previously run programming operation, in corresponding logical cells 404, 406, 408 and 410. For purposes of illustration the charge trapping sites programmed to a high threshold state are shown, although it is understood that charge trapping sites in low threshold states exist but are not shown. The example applied read bias arrangement that is shown in FIG. 4 is used to read the data value that is in the logical cell 406, comprised of the right side charge trapping site of physical memory cell 416 between bit line 422 and bit line 420, and the left side charge trapping site of physical memory cell 418 between bit line 420 and bit line 424. In this example, the charge trapping sites 412 and 414 in adjacent memory cells 416 and 418 are programmed to high threshold states.

In reading the data value that is in the logical cell 406, a source voltage Vs such as about ground potential, is applied to bit line 420. The bit line 420 is shared between the adjacent memory cells 416 and 418. A drain voltage Vd, such as about 2 V, is applied to bit lines 422 and 424, opposite the body regions of the memory cells 416 and 418 from the bit line 420. A gate voltage Vg, such as about 3.5 V, is applied to the word line 426, having a voltage level selected for determining whether the threshold of the physical cells are in a high or low threshold states.

As a result of the read bias voltages, separate read currents can be generated for each of the adjacent memory cells. If both charge trapping sites are in the high threshold state, then the read current through both physical cells will be blocked, or very low. If one of the charge trapping sites is in a low threshold state, then the read current through the physical cell on that side will be high. If both are in a low threshold state, then the read currents through both physical cells will by high. As is shown in FIG. 2, the currents in the bit lines are sensed through separate sense amplifiers and logically combined to determine what the data value is for the logical cell 406.

The applied read bias arrangement that is shown in FIG. 4 can be sequentially applied to every set of adjacent memory cells in the row of memory cells. As a result, the adjacent memory cells in the row of memory cells can be read in their sequence in the row of memory cells. Specifically, such sequential reading can be accomplished by sequentially switching application of Vd to Vs and then back to Vd to the bit line regions in the sequence of such bit line regions in the row of memory cells. Alternatively, multiple sets of adjacent memory cells can be read in parallel, as long as the sets of adjacent memory cells do not share bit line regions with the other sets of adjacent memory cells that are read in parallel with the sets of adjacent memory cells.

Figure 5:
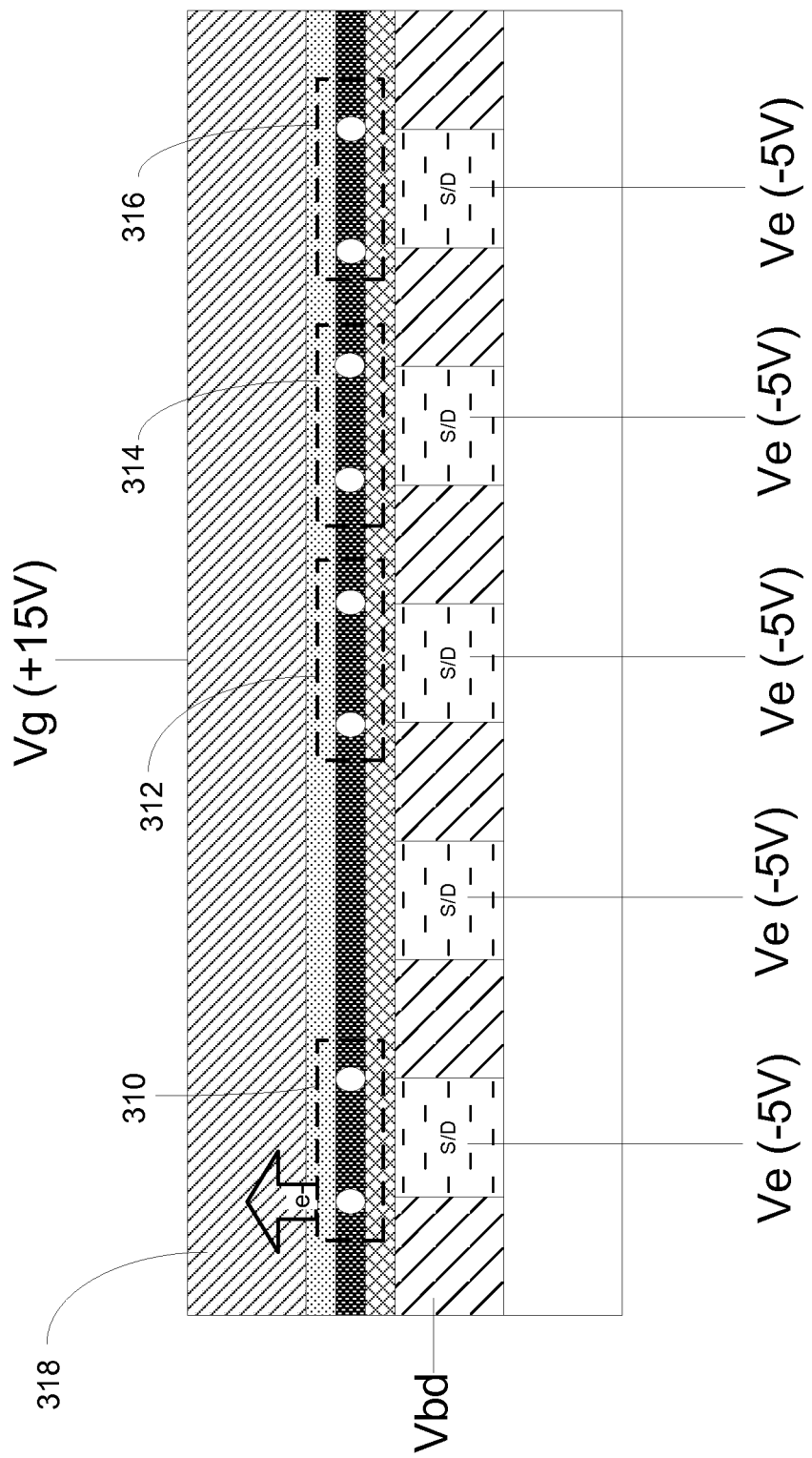
FIG. 5 is a cross-sectional view of a portion of a row of memory cells with an example applied erase bias arrangement.

FIG. 5 is a cross-sectional view of a portion of a row of memory cells showing an example erase bias arrangement. In the example applied erase bias arrangement that is shown in FIG. 5, an erase voltage Ve of about −5V is applied to the bit line regions and the body regions for all the physical cells in the row. A gate voltage Vg of about +15 V is applied to the word line 318 of the memory cells in the row of memory cells. A body voltage Vbd is applied to the body regions. The body voltage Vbd can be the same as the erase voltage Ve, as all of the cells are to be erased in parallel.

The voltage potential that is created between the word line 318 and the bit line regions creates an electric field through the charge trapping sites of the corresponding logical cells 310, 312, 314 and 316. Such electric field causes Fowler-Nordheim (FN) tunneling by which electrons tunnel out of the charge trapping sites to the word line in this example. Other erase biasing arrangements can be applied as well.

Figure 6:
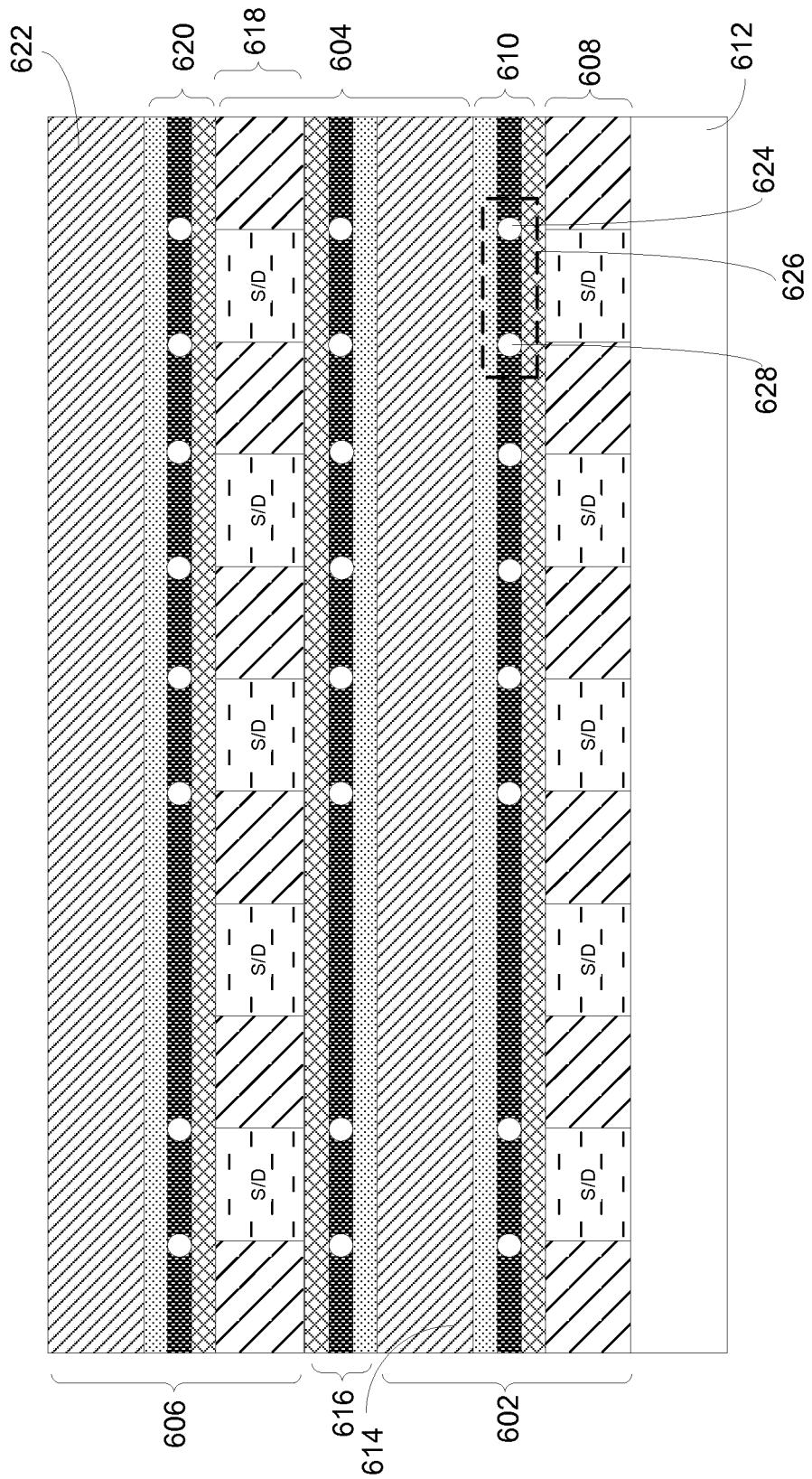
FIG. 6 is a cross-sectional view of a portion of a 3D array of memory cells that includes multiple levels of memory cells.

FIG. 6 is a cross-sectional view of a portion of a 3D array of memory cells that includes multiple levels 602, 604 and 606 of memory cells. The first level 602 of memory cells includes a bit line layer 608, including bit line regions and body regions, on top of a substrate 612. A dielectric charge trapping structure 610 is disposed on the bit line layer, like that described with reference to FIG. 1. A word line 614 is formed on top of the dielectric charge trapping structure 610. Such word line 614 serves as the control gate for the memory cells in the level of memory cells 602. The second level of memory cells 604 includes a dielectric charge trapping structure 616 on top of the word line 614, and a bit line layer 618, on top of the dielectric charge trapping structure 616. The second level of memory cells 604 can share the word line 614 with the first level of memory cells 602. However, as the second level of memory cells 604 and the first level of memory cells 602 do not share the same bit line layer 608 and 618, the memory cells in the first and second levels of memory cells 602 and 604 can be selected and have operations performed on them separately from the corresponding memory cells in the other of the respective first or second level of memory cells.

The 3D array of memory cells shown in FIG. 6 also includes a third level of memory cells 606. The third level of memory cells 606 includes a dielectric charge trapping structure 620 on the bit line layer 618, and a word line 622 on top of the dielectric charge trapping structure 620. The second and third levels of memory cells 604 and 606 share the bit line layer 618. However as the second and third levels of memory cells 604 and 606 do not share word lines 614 and 622, the memory cells in the second and third levels of memory cells 604 and 606 can be selected and have operations performed on them separately from the corresponding memory cells in the other of the respective second or third level of memory cells. The structure shown in FIG. 6 can repeat to provide many layers of memory cells. As illustrated, the 3D structure can be configured to include logical cells (e.g. 626) having charge trapping sites (624, 628) in two adjacent physical memory cells, as described above, improving the reliability and data retention performance of the device.

Figure 7:
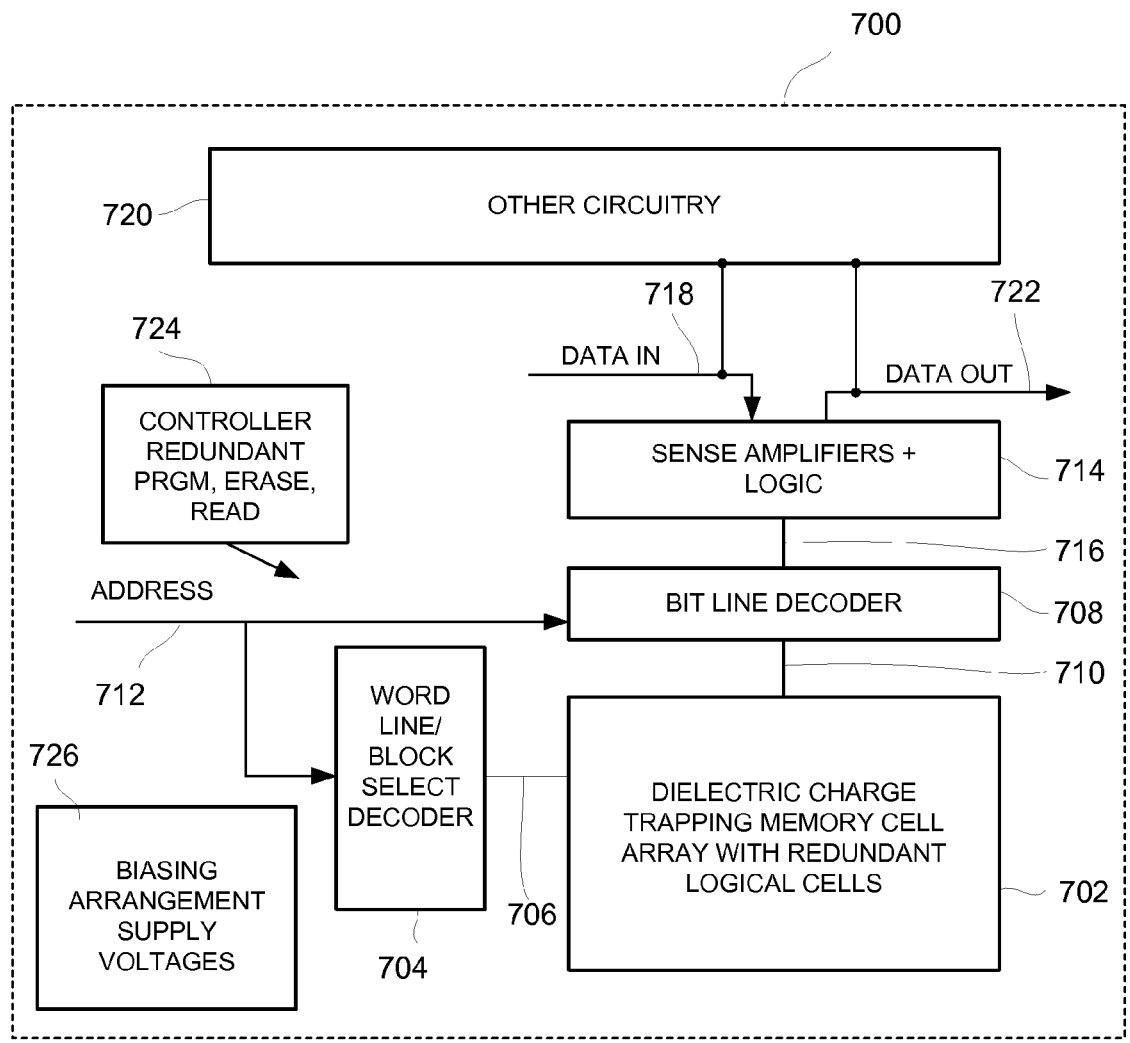
FIG. 7 is a simplified block diagram of an integrated circuit including a memory array of dielectric charge trapping memory cells in which data is stored at corresponding charge trapping sites in adjacent memory cells.

FIG. 7 is a simplified block diagram of an integrated circuit including a memory array of dielectric charge trapping memory cells in which data is stored at corresponding logical cells with redundant charge trapping sites in adjacent memory cells. The integrated circuit 700 includes a memory array 702 of dielectric charge trapping memory cells arranged in an AND array for example. A word line/block select decoder 704 is coupled to and in electrical communication with a plurality of word lines 706 arranged along rows in the memory array 702. A bit line (column) decoder 708 is in electrical communication with a plurality of bit lines 710 arranged along columns in the array 702 for reading and programming the memory cells in the array 702 of dielectric charge trapping memory cells. Logical addresses are supplied on bus 712 to word line/block select decoder 704 and bit line decoder 708. Sense amplifiers and data-in structures in block 714, including voltage and/or current sources for the read, program, program verify and high voltage program retry modes are coupled to bit line decoder 708 via data bus 716. Data is supplied via a data-in line 718 from input/output ports on integrated circuit 700, or from other data sources internal or external to integrated circuit 700, to data-in structures in block 714. Other circuitry 720 may be included on integrated circuit 700, such as a general purpose processor or special purpose application circuitry, or a combination of modules providing system-on-a-chip functionality supported by array 702 of dielectric charge trapping memory cells. Data is supplied via a data-out line 722 from the sense amplifiers in block 714 to input/output ports on integrated circuit 700, or to other data destinations internal or external to integrated circuit 700.

A controller 724 implemented in this example using a bias arrangement state machine, includes logic which controls the application of bias arrangement supply voltage circuitry 726 for the application of bias arrangements described herein. The controller 724 is configured to control the application of bias circuitry voltage 726, such that during a programming operation, corresponding charge trapping sites in adjacent memory cells are programmed in parallel with the same threshold state. The controller 724 is also configured to control the application of bias circuitry voltage sources 726, such that during a read operation, adjacent memory cells with corresponding charge trapping sites are read in parallel, or sequentially, and the results logically combined to determine the stored data value. Controller 724 may be implemented using special-purpose logic circuitry as known in the art. In alternative embodiments, controller 724 comprises a general-purpose processor, which may be implemented on the same integrated circuit to execute a computer program to control the operations of the device. In yet other embodiments, a combination of special-purpose logic circuitry and a general-purpose processor may be utilized for implementation of controller 724.

A method to automatically generate a redundancy bit for each bit of data in a dielectric charge trapping memory is described, along with a method to read out those redundant bits. In one example, the program bias involves applying voltages to a buried diffusion region acting as a bit line and word line in an AND array (like that used in some NROM devices) to generate FN for programming and erase. This way two charge trapping sites beside the same buried diffusion bit line (not sites on each side of the same channel) will be programmed or erased together. In 3D memory applications for example, the use of polysilicon body regions can result in many defects that harm data retention, which can be improved by the redundant memory configuration described above. Also, in thin film transistor devices, the program margins can be low, because of the difficulty in applying sufficient currents across the array for program and erase operations, which can be improved by the redundant memory configuration described above. Because the thresholds in two physical cells are used to represent a single data value, the two physical cells can provide in effect, 1:1 ECC redundancy. In addition to these advantages, the array can be implemented with cell sizes on the order of $4F^2$ even with effectively 1:1 ECC.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A method of operating memory cells within an array of dielectric charge trapping memory cells, the array of dielectric charge trapping memory cells including a plurality of bit lines BL(i), for i between 0 and N, and a plurality of word lines WL(j), for j between 1 and M, the array including a plurality of columns of memory cells and a plurality of rows of memory cells, each column being disposed between bit line BL(i) and bit line BL(i+1), and each row R(j) of the memory cells being coupled to a corresponding word line WL(j), and wherein a memory cell in the array has a first charge trapping site adjacent to the bit line BL(i+1) and a second charge trapping site adjacent to the BL(i), comprising:
    writing a data value in a logical cell for a selected column address $A_C(y)$, wherein y is between 1 and N−1, and a selected row address $A_R(x)$, wherein x is between 1 and M in the array, by applying program and erase operations to set threshold states representing said data value both in the first charge trapping site in the memory cell between bit lines BL(y−1) and BL(y), and in the second charge trapping site in the memory cell between bit lines BL(y) and BL(y+1); and
    reading a data value for a selected column address $A_C(y)$, wherein y is between 1 and N−1, and a selected row address $A_R(x)$, wherein x is between 1 and M, by sensing the threshold states both in the first charge trapping site in the memory cell between bit lines BL(y−1) and BL(y), and in the second charge trapping site in the memory cell in column between bit lines BL(y) and BL(y+1), and determining that the data value is that corresponding with the highest sensed threshold state.

2. The method of claim 1, wherein the program and erase operations store one bit per selected column address and selected row address, said determining includes using said highest threshold state as a logical value of "1," using a lower threshold state as a logical value of "0," and applying a logical OR operation to the assigned logical values.

3. The method of claim 1, wherein the program operation applies a first program voltage to the word line WL(j) and a second program voltage to the bit line BL(i) causing charge to tunnel into the first charge trapping site in the memory cell between bit lines BL(i−1) and BL(i), and in the second charge trapping site in the memory cell between bit lines BL(i) and BL(i+1).

4. The method of claim 3, wherein the program bias setting thresholds cause charge to tunnel from the word line.

5. The method of claim 4, wherein the charge tunneling occurs through Fowler-Nordheim tunneling.

6. The method of claim 1, wherein writing the data value further includes writing data values for multiple selected column addresses $A_C(y)$ and selected row addresses $A_R(x)$ in parallel.

7. An integrated circuit, comprising:
    an array of dielectric charge trapping memory cells, the array of dielectric charge trapping memory cells including a plurality of bit lines BL(i), for i between 0 and N, and a plurality of word lines WL(j), for j between 1 and M, the array including a plurality of columns of memory cells and a plurality of rows of memory cells, each column being disposed between bit line BL(i) and bit line BL(i+1), and each row R(j) of the memory cells being coupled to a corresponding word line WL(j), and wherein a memory cell in the array has a first charge trapping site adjacent to the bit line BL(i+1) and a second charge trapping site adjacent to the BL(i); and
    read and write circuitry coupled to the array configured to:
        write a data value in a logical cell for a selected column address $A_C(y)$, wherein y is between 1 and N−1, and a selected row address $A_R(x)$, wherein x is between 1 and M in the array, by applying program and erase operations to set threshold states representing said data value both in the first charge trapping site in the memory cell between bit lines BL(y−1) and BL(y), and in the second charge trapping site in the memory cell between bit lines BL(y) and BL(y+1); and
        read a data value for a selected column address $A_C(y)$, wherein y is between 1 and N−1, and a selected row address $A_R(x)$, wherein x is between 1 and M, by sensing the threshold states both in the first charge trapping site in the memory cell between bit lines BL(y−1) and BL(y), and in the second charge trapping site in the memory cell in column between bit lines BL(y) and BL(y+1), and determine that the data value is that corresponding with the highest sensed threshold state.

8. The integrated circuit of claim 7, wherein the program and erase operations store one bit per selected column address and selected row address, said determining includes using said highest threshold state as a logical value of "1," using a lower threshold state as a logical value of "0," and applying a logical OR operation or a logical NOR operation to the assigned logical values.

9. The integrated circuit of claim 7, wherein the program operation applies a first program voltage to the word line WL(j) and a second program voltage to the bit line BL(i) causing charge to tunnel into the first charge trapping site in the memory cell between bit lines BL(i−1) and BL(i), and in the second charge trapping site in the memory cell in column between bit lines BL(i) and BL(i+1).

10. The integrated circuit of claim 9, wherein the program bias setting thresholds cause charge to tunnel from the word line.

11. The integrated circuit of claim 10, wherein the charge tunneling occurs through Fowler-Nordheim tunneling.

12. The integrated circuit of claim 7, including circuitry to write data values for multiple selected column addresses $A_C(y)$ and selected row addresses $A_R(x)$ in parallel.

13. The integrated circuit of claim 7, wherein the array comprises multiple layers of memory cells.

14. The integrated circuit of claim 7, wherein the array comprises thin film transistor memory cells.

* * * * *